United States Patent [19]

Kemlage

[11] 4,254,161

[45] Mar. 3, 1981

[54] PREVENTION OF LOW PRESSURE CHEMICAL VAPOR DEPOSITION SILICON DIOXIDE UNDERCUTTING AND FLAKING

[75] Inventor: Bernard M. Kemlage, Kingston, N.Y.

[73] Assignee: International Business Machines Corporation, Armonk, N.Y.

[21] Appl. No.: 66,964

[22] Filed: Aug. 16, 1979

[51] Int. Cl.³ .............................................. B05D 5/12
[52] U.S. Cl. ...................................... 427/94; 357/54; 427/95
[58] Field of Search ................ 427/94, 95, 99; 357/54

[56] References Cited

U.S. PATENT DOCUMENTS

| | | | |
|---|---|---|---|
| 3,494,809 | 2/1970 | Ross | 29/578 X |
| 3,607,480 | 9/1971 | Harrap et al. | 357/54 X |
| 3,728,784 | 4/1973 | Schmidt | 29/578 |
| 3,764,423 | 10/1973 | Hauser, Jr. et al. | 357/54 X |
| 4,002,512 | 1/1977 | Lim | 350/96.12 X |
| 4,091,169 | 5/1978 | Bohg et al. | 427/94 X |

OTHER PUBLICATIONS

Rosler, R. S., "Low Pressure CVD Production Processes for Poly, Nitride, and Oxide", *Solid State Technology*, Apr. 1977, pp. 66–68.

Oroshnik J., et al., *Pyrolytic Deposition of Silicon Dioxide in an Evacuated System*, Journal Electrochemical Society Solid State Science, vol. 115, p. 649, 1968.

Sandor, *Pyrolytic Growth of Silicone Oxide*, Presented at The Electrochemical Society Meeting, Los Angeles, California, May 6–10, 1962.

*Primary Examiner*—Evan K. Lawrence
*Attorney, Agent, or Firm*—George O. Saile

[57] ABSTRACT

A chemical vapor deposition process wherein a silicon nitride barrier layer greater than about 50 Angstroms in thickness is formed over a silicon substrate and a low pressure chemical vapor deposition of a chlorosilane and a nitrous oxide oxidizing gas is used to form a silicon dioxide layer over the silicon nitride layer, where the silicon dioxide layer has a thickness between 2500 and 100,000 Angstroms. This process overcomes the problem of the low pressure chemical vapor deposition of silicon dioxide that does not use the silicon nitride layer. The problem is degradation of the silicon dioxide layer during subsequent oxidation cycles.

10 Claims, 6 Drawing Figures

PREVENTION OF LOW PRESSURE CHEMICAL VAPOR DEPOSITION SILICON DIOXIDE UNDERCUTTING AND FLAKING

CROSS REFERENCE TO RELATED APPLICATION

B. M. Kemlage patent application, Ser. No. 066,965, filed Aug. 16, 1979, simultaneously with this patent application and entitled "Low Pressure Chemical Vapor Deposition of Silicon Dioxide With Oxygen Enhancement of the Dichlorosilane-Nitrous Oxide Reaction."

BACKGROUND OF THE INVENTION

1. Technical Field

The invention relates to methods for forming low pressure chemical vapor deposited silicon dioxide layers and more particularly to a chemical reactive deposition of silicon dioxide on a silicon nitride layer by reaction of a chlorosilane and an oxidizing gas at low pressure conditions.

2. Background Art

Silicon dioxide is widely used as an insulator and/or masking layer in the formation of semiconductor and integrated circuit devices. An important method for forming silicon dioxide is by the thermal growth method involving the thermal oxidation of silicon in the presence of oxygen or steam at relatively high temperatures above 900° C. and usually 1000° C. or more. The method is a high temperature technique which could cause a shift in the P-N junction boundary during the oxidation process. A further problem is that the method is only suitable when the silicon dioxide is to be grown on silicon. A further method for growing a silicon dioxide layer involves the use of a chemical vapor deposit reaction involving the gaseous oxidation of silicon tetrachloride, silane, dichlorosilane, or the like. This method has been used for many years at atmospheric pressure and more recently at low pressures of the order of less than 1 torr.

The atmospheric pressure method of chemical vapor deposition of silicon dioxide from a gaseous oxidation of silicon tetrachloride or silane has generally involved undesirably high temperatures such as between 900° to 1200° C. These temperatures would result in the problem of a shift of P-N junction boundaries which is undesirable. Low temperatures below 900° C., gaseous oxidation of silane or silicon tetrachloride have resulted in poorer quality silicon dioxide films than the thermally grown silicon dioxide films. The M. J. Lim U.S. Pat. No. 4,002,512, entitled "Method of Forming Silicon Dioxide", dated Jan. 11, 1977, teaches a low temperature method for forming silicon dioxide films of high quality which utilizes dichlorosilane which is oxidized using an oxidizing gas such as $O_2$, $CO_2$, $N_2O$, $H_2O$, etc., combined with an inert carrier gas such as He, A, $N_2$, $H_2$, etc.

The use of a low pressure hot wall system for the chemical vapor deposition of silicon dioxide is described by J. Sandor presented at Electro-Chemical Society Meeting, Los Angeles, Calif., May 6–10, 1962, and by J. Oroshnik, et al, in Journal Electro-Chemical Society Solid State Science, Vol. 115, page 649, 1968, and by R. S. Rosler, entitled "Low Pressure CVD Production Processes for Poly, Nitride, and Oxide", in Solid State Technology, April 1977, pp. 63–70. The R. S. Rosler paper is a survey paper of the various low pressure chemical vapor deposited methods for forming polycrystalline silicon, silicon nitride and silicon dioxide films in the semiconductor industry. On page 68, Rosler describes the low pressure reactions of dichlorosilane and nitrous oxide in a temperature range of 800° C. to 920° C.

The gaseous reaction of chlorosilanes, and more particularly dichlorosilane, with nitrous oxide has been found to produce silicon dioxide layers which were of high quality in their refractive index, but were susceptible to degradation during subsequent oxidation cycles. The phenomena of degradation is believed to be an undercutting phenomena which results in flaking of the silicon dioxide layer that has been undercut. The resulting structures of this problem are as shown in FIGS. 1 and 2. FIG. 3 is a non-undercut plane view of a silicon dioxide layer formed by the present process.

Silicon nitride is an effective barrier to the penetration of impurities into the surface of a semiconductor body. U.S. Pat. No. 3,494,809 to C. A. Ross entitled "Semiconductor Processing" suggests the use of silicon nitride on the backside of semiconductor wafers during epitaxial growth on the front surface of the wafer, oxidation, etching and diffusion steps.

SUMMARY OF THE INVENTION

In accordance with the present invention, this degradation problem is overcome by the use of a silicon nitride film onto which the silicon dioxide layer is deposited. The silicon nitride layer must be greater than about 50 Angstroms in thickness. A thermally grown silicon dioxide layer may be used between the silicon substrate and the silicon nitride layer.

DETAILED DESCRIPTION

The low pressure chemical vapor deposited silicon dioxide, $SiO_2$, layers by the gas phase reaction of chlorosilanes, particularly dichlorosilane, and nitrous oxide, was undercut by a 1050° C. hydrogen chloride-dry oxidation cycle. This undercutting phenomena proceeds far enough that actual flaking of the $SiO_2$ layer occurs. The characteristics of the as-deposited $SiO_2$ films appear excellent. The surfaces are planar and featureless, the refractive index is 1.456 and a I.R. Spectrophotometer analysis produces a graph identical of that of otherwise formed high quality $SiO_2$ layers. The etch rate in 5:1 buffered hydrofluoric acid is slightly less than other high quality chemical vapor deposited $SiO_2$ layers and no chemical attack is observed in pyrocatechol solution when it is used as a mask. The pin hole density has been measured by metal capacitor oxide breakdown to be zero.

The as-deposited films were placed in Argon annealing furnaces at 1000° C. for 30 minutes and 1100° C. for 60 minutes. The annealing had no apparent effect on any of the film characteristics.

The surfaces remained featureless and the thickness and refractive index were unchanged leading one to assume that the $SiO_2$ is deposited in a densified state. The same is true for hydrogen annealing at 1150° for 30 minutes.

Figure 1:
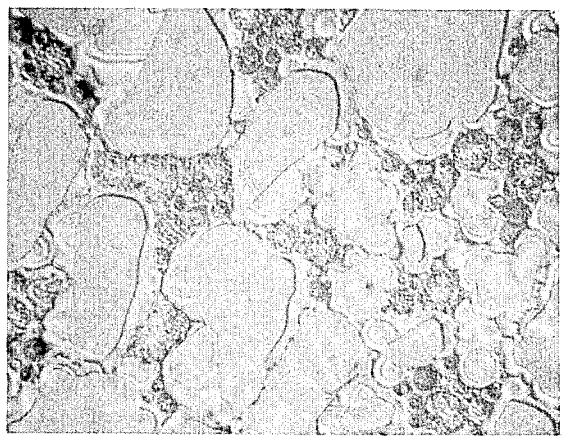
FIGS. 1 and 2 are photographs at 216× magnification of degraded low pressure chemical vapor deposited silicon dioxide films.
Figure 2:
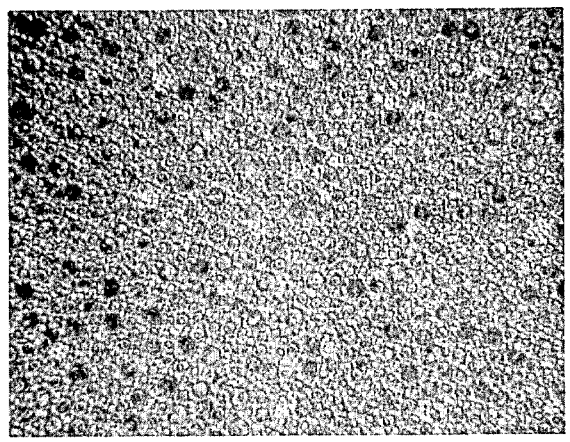
Figure 3:
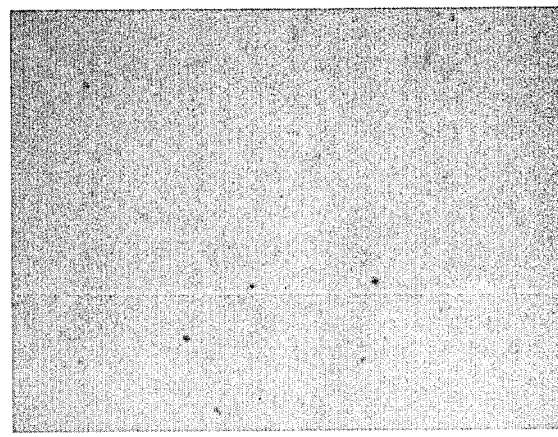
FIG. 3 is a photograph at 216× magnification of a silicon dioxide film which has not been degraded and which was made according to the method of the present invention.
Figure 4:
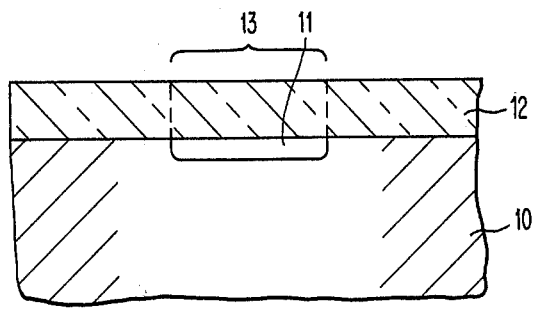
FIG. 4 is a schematic cross-section that shows the undercutting phenomena.

The $SiO_2$ layer was found to react in the presence of hydrogen chloride, $H_2O$ and $O_2$ at high temperatures. The reaction ranges from dense mound formation to flaking films. FIG. 4 illustrates the undercut phenomenon wherein the silicon substrate 10 is attacked to form an opening 11 at the silicon dioxide layer 12 to silicon substrate interface. The portion 13 of the silicon dioxide layer can break away above the opening 11. The undercutting phenomena occurs for 2% hydrogen chloride-$O_2$ oxidations performed at 1050° C., but it does not occur at 850° C. Dry $O_2$ oxidations at 1100° C. form dense mounds in the films after 60 minutes with no increase in density after 220 minutes. The same dense mound formation occurs for wet oxidations at 1000° C. Increasing the wet oxidation temperature to 1100° C. results in complete undercutting. This latter condition of an 1100° C. dry-wet-dry (5 minutes-10 minutes-5 minutes) oxidation cycle was utilized as a test criteria for films deposited under various conditions.

Films which were annealed in Argon at 1100° C. for 60 minutes, oxygen at 1100° for 220 minutes, or hydrogen at 1150° C. for 30 minutes, were tested. These processes produced no observable benefit. Process parameters which have been tested include growth rate (25 A/min to 220 A/min), $N_2O:SiH_2Cl_2$ ratios (10:1 to 3:1), system pressure (300 mtorr to 800 mtorr) and temperatures (890° C. to 940° C.). Of these only temperature has an effect on the results. It has been determined that the problem becomes more thickness sensitive for depositions performed at lower temperatures. For thicknesses less than 1500 Å a bubble formation occurs. From about 1500 Å to about 2500 Å these bubbles increase in density to form plates which appear oriented to the substrate. For thicknesses greater than 2500 Å the undercutting and flaking phenomena is observed. Using a scanning Electron Microscope, it was determined that the mounds and plates were probably due to a chemical attack of the silicon substrate. The mounds and plates are shallow etch pits in the silicon substrate.

The problem is believed to be caused by the inclusion of chlorine in the deposited $SiO_2$ film. This bonded chlorine may occur due to incomplete oxidation of the chlorosilane, such as dichlorosilane $SiH_2Cl_2$, probably in the form of $SiO_xCl_y$. A physical analysis of the deposited $SiO_2$ films by Auger and Raman spectroscopy confirmed the presence of chlorine.

A clear indication of chlorine was seen at the $SiO_2/Si$ interface, but an exact determination of concentration could not be achieved by the Auger method. Raman spectroscopy, on the other hand, defined a chlorine inclusion of approximately 2.7% throughout the as-deposited $SiO_2$ layer thickness in tested samples.

Figure 5:
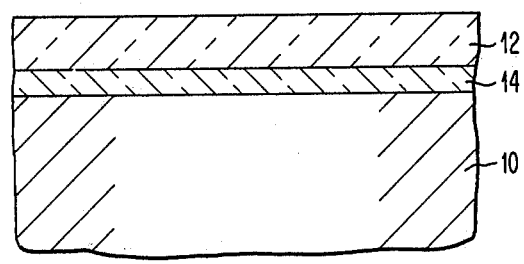
FIGS. 5 and 6 illustrate the resulting structures of the present method which silicon dioxide films that do not flake after oxidation cycling.
Figure 6:
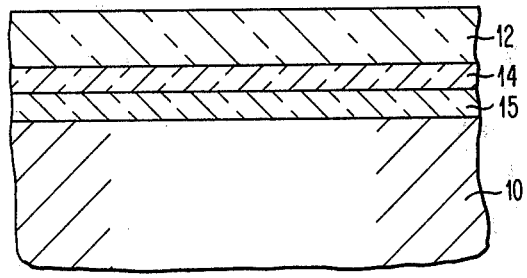

In an attempt to obtain a protective barrier to the attack of the silicon substrate, polycrystalline silicon was ruled out since the problem was initially observed on polycrystalline silicon. Thermal $SiO_2$ and chemical vapor deposited $SiO_2$ were formed to be slightly effective only when the barrier thickness was very large and equivalent to the low pressure chemically deposited $SiO_2$ film thickness itself. Silicon nitride was determined to be an effective barrier when deposited at thicknesses greater than 50 Angstroms either directly on silicon, as shown in FIG. 5, or on a silicon dioxide buffer layer, as shown in FIG. 6. The preferred thickness of the silicon nitride layer 14 is between about 100 to 500 Angstroms. The silicon nitride may be as thick as 3000 Å. Thicknesses greater than 3000 Å cause stress problems. Low pressure chemically vapor deposited $SiO_2$ layers of up to 2.0 μm were successfully oxidized in steam at 1100° C. for 60 minutes without undercutting except at silicon nitride pinholes.

The silicon nitride is preferably deposited at one atmosphere using a mixture of $SiH_4$ and $NH_3$ at a deposition temperature range between about 700° to 1000° C.

The under-layer silicon dioxide 15 is preferably formed by thermal oxidation of the silicon substrate at 1000° C. in steam. The thickness of the $SiO_2$ is between about 100 and 5000 Angstroms.

The use of the silicon nitride layer allows quality silicon dioxide layers of from 1000 to 100,000 Angstroms.

The following examples are included merely to aid in the understanding of the invention and variations may be made by one skilled in the art without departing from the spirit and scope of the invention.

EXAMPLE 1

Silicon nitride was deposited upon a series of wafers by:

Reactants: $SiH_4$ $NH_3$ in a $N_2$ carrier gas
Temp: 800° C.
Growth Rate: Approx. 100 Å/min.

The series of wafers containing $Si_3N_4$ layers of 0, 25, 50, 100, 200, and 500 Å in thickness directly on the silicon substrate were used for the deposition of 1 μm of LPCVD-$SiO_2$ from a high temperature LPCVD-$SiO_2$ system. These wafers were then steam annealed at 1100° C. to determine the effectiveness of the barrier.

For all wafers with greater than 50 Å of $Si_3N_4$ the barrier was completely effective in eliminating undercutting.

EXAMPLE 2

A series of wafers identical to those of Example #1 were prepared with the exception that a 1000 Å thermally grown $SiO_2$ was formed between the silicon wafer and the barrier $Si_3N_4$. All subsequent processing was the same.

The results were the same as Example #1. The silicon oxide had no effect on the $Si_3N_4$ barrier layer.

While the invention has been particularly described with reference to the preferred embodiments thereof, it would be understood by those skilled in the art that the foregoing and other changes in form and details may be made therein without departing from the spirit and scope of the invention.

Having thus described my invention, what I claim as new, and desire to secure by Letters Patent is:

1. A method for forming a silicon dioxide layer on a semiconductor substrate in the manufacture of an integrated circuit wherein the said layer is not subject to degradation during subsequent oxidation cycles comprising:

forming a silicon nitride layer of greater than about 50 Angstroms in thickness over a surface of said substrate; and mixing a gaseous chlorosilane with a nitrous oxide oxidizing gas at a temperature between about 800° C. to 1200° C. in a pressure of less than about 5 torr to deposit said silicon dioxide layer onto said silicon nitride layer, wherein the thickness of said silicon dioxide layer is between about 2500 and 100,000 Angstroms.

2. The method of claim 1 wherein said silicon nitride layer is deposited by mixing silane and ammonia in a nitrogen carrier gas at temperatures between about 700° C. and 1000° C.

3. The method of claim 1 wherein the said silicon nitride layer is between about 50 to 3000 Angstroms in thickness.

4. The method of claim 1 wherein the said substrate is silicon and a silicon dioxide layer is formed by thermal oxidation thereon prior to the said forming of a silicon nitride layer thereover.

5. The method of claim 4 wherein the thickness of said silicon dioxide layer formed by thermal oxidation is between about 100 to 5000 Angstroms.

6. The method of claim 1 wherein said chlorosilane is dichlorosilane and is combined with said oxidizing gas at a temperature between about 850° C. to 1000° C.

7. The method for forming a silicon dioxide layer on a semiconductor substrate in the manufacture of an integrated circuit wherein the said layer is not subject to degradation during subsequent oxidation cycles comprising:

forming a silicon nitride layer of greater than about 50 Angstroms in thickness over a surface of said substrate; and combining gaseous dichlorosilane and nitrous oxide at a temperature between about 850° C. to 1000° C. in a pressure less than about 5 torr to deposit said silicon dioxide layer onto said silicon nitride layer, wherein the thickness of said silicon dioxide layer is between about 2500 and 100,000 Angstroms.

8. The method of claim 7 wherein said silicon nitride layer is deposited by the mixing of silane and ammonia in a nitrogen carrier gas at temperatures between about 700° C. and 1000° C.

9. The method of claim 7 wherein the said substrate is silicon and a silicon dioxide layer is formed by a thermal oxidation thereon before said forming of silicon nitride layer.

10. The method of claim 9 wherein said silicon dioxide layer formed by thermal oxidation is between about 100 to 5000 Angstroms in thickness, and said silicon nitride layer is between about 50 and 3000 Angstroms in thickness.

* * * * *